(12) United States Patent
Oren

(10) Patent No.: US 7,343,541 B2
(45) Date of Patent: Mar. 11, 2008

(54) DATA INTEGRITY IN PROTOCOL OFFLOADING

(75) Inventor: Amit Oren, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 674 days.

(21) Appl. No.: 10/756,880

(22) Filed: Jan. 14, 2004

(65) Prior Publication Data

US 2004/0205441 A1 Oct. 14, 2004

Related U.S. Application Data

(60) Provisional application No. 60/439,921, filed on Jan. 14, 2003.

(51) Int. Cl.
*H03M 13/00* (2006.01)
(52) U.S. Cl. .............. 714/758; 370/219; 370/220; 370/221; 370/222; 379/242
(58) Field of Classification Search ............. 714/758, 714/2, 48; 370/219–22; 379/242
See application file for complete search history.

(56) References Cited

U.S. PATENT DOCUMENTS

| | | | |
|---|---|---|---|
| 4,597,083 A | 6/1986 | Stenerson | |
| 4,675,869 A | 6/1987 | Driessen | |
| 5,131,012 A * | 7/1992 | Dravida | ............... 375/357 |
| 5,410,546 A | 4/1995 | Boyer et al. | |
| 5,594,861 A * | 1/1997 | Jonsson et al. | ............... 714/2 |
| 5,778,013 A | 7/1998 | Jedwab | |
| 5,951,707 A | 9/1999 | Christensen et al. | |
| 6,223,320 B1 | 4/2001 | Dubey et al. | |
| 6,226,771 B1 * | 5/2001 | Hilla et al. | ............... 714/758 |
| 6,411,599 B1 * | 6/2002 | Blanc et al. | ............... 370/219 |
| 6,532,565 B1 | 3/2003 | Roth et al. | |
| 6,681,364 B1 | 1/2004 | Calvignac et al. | |
| 6,973,084 B1 * | 12/2005 | Jha | ............... 370/392 |
| 7,016,329 B2 * | 3/2006 | Padovani et al. | ............... 370/332 |
| 2003/0031119 A1 * | 2/2003 | Kim et al. | ............... 370/200 |
| 2003/0066011 A1 | 4/2003 | Oren | |

OTHER PUBLICATIONS

R.N. Williams, "A Painless Guide to CRC Error Detection Algorithms", Rocksoft Pty. Ltd., Hazelwood Park, Australia, 1993.
"When the CRC and TCP Checksum Disagree", by Stone, et al, SIGCOMM 2000, pp. 309-319.
U.S. Appl. No. 60/439,921, filed Jan. 14, 2003, entitled: "Improving Data Integrity in Protocol Offloading".

* cited by examiner

*Primary Examiner*—Guy J. Lamarre
(74) *Attorney, Agent, or Firm*—McAndrews, Held & Malloy, Ltd.

(57) ABSTRACT

A method for data verification is provided. An input block of data is received together with a modulo-based input error detection code associated with the input block, the input block comprising a plurality of sub-blocks. A subset of the sub-blocks is selected to be included in an output block. An error correction term is determined based on the selected subset. The selected subset of the sub-blocks is concatenated together with the input error detection code and the error correction term to generate an output block for conveyance to a destination processor.

67 Claims, 4 Drawing Sheets

DATA INTEGRITY IN PROTOCOL OFFLOADING

CROSS-REFERENCE TO RELATED APPLICATIONS

This application claims the benefit of U.S. Provisional Patent Application 60/439,921, filed Jan. 14, 2003, which is incorporated herein by reference. This application is related to U.S. patent application Ser. No. 10/123,024, filed Apr. 11, 2002, published as U.S. Patent Application Publication 2003/0066011, now U.S. Pat. No. 7,065,702, which is assigned to the assignee of the present patent application and is incorporated herein by reference.

FIELD OF THE INVENTION

The present invention relates generally to digital error detection, and specifically to methods and devices for computing and checking error detection codes.

BACKGROUND OF THE INVENTION

Error detection codes are used in all sorts of digital communication applications to enable the receiver of a message transmitted over a noisy channel to determine whether the message has been corrupted in transit. Before transmitting the message, the transmitter calculates an error detection code based on the message contents, and appends the code to the message. The receiver recalculates the code based on the message that it has received and compares it to the code appended by the transmitter. If the values do not match, the receiver determines that the message has been corrupted and, in most cases, discards the message.

Cyclic redundancy codes (CRCs) are one of the most commonly-used types of error correcting codes. To calculate the CRC of a message, a polynomial $g(X)$ is chosen, having $N+1$ binary coefficients $g_0 \ldots g_N$. The CRC is given by the remainder of the message, augmented by N zero bits, when divided by $g(X)$. In other words, the CRC of an augmented message $D(X)$ is simply $D(X) \bmod g(X)$, i.e., the remainder of $D(X)$ divided by $g(X)$. There are many methods known in the art for efficient hardware and software implementation of CRC calculations. A useful survey of these methods is presented by Williams in "A Painless Guide to CRC Error Detection Algorithms" (Rocksoft Pty Ltd., Hazelwood Park, Australia, 1993), which is incorporated herein by reference.

CRCs are sometimes applied to more than one protocol of a data communications protocol stack. For example, in the protocol stack of the recently proposed Remote Direct Memory Access (RDMA) over Internet Protocol (IP) standard, CRCs are applied to both the Ethernet MAC and Marker PDU Aligned (MPA) protocols.

In high bandwidth systems, e.g., systems supporting 10 Gbps line rates, protocol stack processing may be resource-intensive for a host that interfaces with a communications network. Therefore, it is sometimes desirable for the host to offload a portion of the protocol stack processing to a network interface device (NID) that provides the host with an interface to the network. Protocols that are processed entirely by the NID are said to be "terminated" by the NID.

A drawback to such offloading is that the data transferred from the NID to the host may be corrupted by the NID and/or during transfer from the NID to the host. When the host does not terminate the data-intensive protocol or protocols that include the CRC calculation, the host is generally unable to detect such data corruption using methods known in the art. To overcome this drawback, it has been proposed that the NID calculate a CRC for the data to be transferred to the host. If the data has already been corrupted in the NID prior to calculation of the CRC, however, the CRC merely ensures accurate transmission of corrupted data to the host.

It has been demonstrated that data corruption by network hardware is a common occurrence. For example, Stone et al., in "When the CRC and TCP checksum disagree," SIGCOMM 2000, pp. 309-319, studied nearly 500,000 IP packets which failed the Transport Control Protocol (TCP), User Datagram Protocol (UDP), or IP checksum. They write, "Probably the strongest message of this study is that the networking hardware is often trashing the packets which are entrusted to it."

The above-mentioned U.S. patent application Publication 2003/0066011, to Oren, describes a method for error detection that includes receiving a block of data that is divided into a plurality of sub-blocks having respective offsets within the block, and processing the data in each of the sub-blocks so as to compute respective partial error detection codes for the sub-blocks. The partial error detection codes of the sub-blocks are modified responsively to the respective offsets, and the modified partial error detection codes are combined to determine a block error detection code for the block of data.

SUMMARY OF THE INVENTION

In embodiments of the present invention, a host computer system offloads a portion of protocol stack processing to a network interface device (NID), which provides the host with an interface to a communications network. During processing of inbound network traffic, the NID receives input blocks of data from the network, which blocks include respective modulo-based error detection codes, such as a CRCs. The NID processes each of the input data blocks by dividing the input block into a plurality of sub-blocks, and concatenating a subset of the sub-blocks, not necessarily in their original order, to produce an output block. The NID determines an error correction term for the output block. This error term is equal to a binary difference between the input error detection code and an error detection code of the output block. The NID appends the original error detection code and the error correction term to the output block, and passes the output block to the host.

In order to determine whether to accept or reject the output block, the host calculates the error detection code of the output block, and compares this value to the original error detection code of the input block and the error correction term. To make this comparison, the host typically combines the original error detection code of the input block and the error correction term using an XOR operation. Thus, if data of the output block is corrupted during processing or transmission by the NID, data verification at the recipient fails, even if the NID used the corrupted data to compute the error correction term. This verification failure occurs because the NID propagates the original error detection code of the input block to the recipient, and the recipient uses this original error detection code in combination with the error correction term for data validation.

Typically, in order to determine the error correction term for the output block, the NID calculates a partial error correction term for each of the sub-blocks, and combines the partial error correction terms using XOR operations. For each sub-block that is not included in the output block (i.e., that the NID has removed during processing), the NID calculates the partial error correction term by binary-shifting the value of the sub-block by a number of bits equal to the offset of the sub-block in the input block, and taking the modulo of the result. For each sub-block that is included in the output block, the NID calculates the partial error correction term by XORing (a) the modulo of the value of the sub-block binary shifted by a number of bits equal to the offset of the sub-block in the input block and (b) the modulo of the value of the sub-block binary shifted by a number of bits equal to the offset of the sub-block in the output block. In other words, the NID analyzes the position of the sub-block in the output block relative to the position thereof in the input block and uses the position information in calculating the error correction term.

In some embodiments of the present invention, during processing of outbound network traffic, the NID receives input blocks of data from the host, which blocks include respective modulo-based error detection codes, such as a CRCs. For each of the input blocks, the NID assembles an output data block by dividing the input block into sub-blocks, and interspersing additional sub-blocks containing protocol-related data, such as headers, markers, and padding. To compute an error detection code, such as a CRC, for the output block, the NID calculates an error correction term based on the positions of the sub-blocks in the output block relative to their respective positions in the input block, as described hereinabove. The NID applies this error correction term to the error detection code of the input block, typically using an XOR operation, in order to produce the error detection code of the output block. Thus, if data of the input block is corrupted during transmission to the NID or processing by the NID, the NID does not calculate the error detection code of the output block over the corrupted data. Instead, the NID propagates the error detection code of the input block, as modified, to the recipient.

For some applications, the techniques described herein are used with the recently proposed RDMA over IP protocol stack, which includes the following protocols, arranged from highest to lowest level: Remote Direct Memory Access Protocol (RDMAP), Direct Data Placement (DDP) Protocol, Marker PDU Aligned (MPA) Framing, TCP, IP, and Ethernet MAC. CRCs are applied to both the Ethernet MAC and MPA protocols. For example, the host may terminate RDMAP, while the NID terminates all of the other protocols of the RDMA protocol stack, and passes the original CRC and the error correction term (as described above) to the host for use in verifying the RDMA payload.

There is therefore provided, in accordance with an embodiment of the present invention, a method for data verification, including:

receiving an input block of data together with a modulo-based input error detection code associated with the input block, the input block including a plurality of sub-blocks;

selecting a subset of the sub-blocks to be included in an output block;

determining an error correction term based on the selected subset; and concatenating the selected subset of the sub-blocks together with the input error detection code and the error correction term to generate an output block for conveyance to a destination processor.

Typically, the error correction term is equal to a binary difference between the input error detection code and an output error detection code of the output block.

For some applications, selecting the subset includes determining an order of the sub-blocks in the output block, and determining the error correction term includes determining the error correction term responsively to the order.

For some applications, the method further includes, upon receipt of the output block at the destination processor, determining whether to accept or reject the output block by computing an output error detection code of the output block, and comparing the output error detection code to the input error detection code and the error correction term. Comparing the output error detection code may include applying an XOR operation to the input error detection code and the error correction term.

For some applications, determining the error correction term includes processing data in each of the sub-blocks so as to compute respective sub-block error detection codes. Typically, processing the data in each of the sub-blocks includes taking a modulo of the data. Taking the modulo may include computing the modulo with respect to a predetermined polynomial, so as to determine a cyclic redundancy code (CRC) of the sub-block. Typically, computing the modulo includes using the predetermined polynomial that was applied in computing the input error detection code.

For some applications, the sub-blocks have respective input offsets within the input block, and determining the error correction term includes: determining respective sub-block error correction terms for the sub-blocks, responsively to the respective sub-block error detection codes and input offsets; and combining the sub-block error correction terms to determine the error correction term. Determining the respective sub-block error correction terms may include binary-shifting the respective sub-block error detection codes by respective numbers of bits equal to the respective input offsets, and computing respective modulos of the respective shifted values. Alternatively or additionally, the sub-blocks in the selected subset have respective output offsets within the output block, and determining the respective sub-block error correction terms for the sub-blocks in the subset includes determining the respective sub-block error correction terms responsively to the respective sub-block error detection codes, input offsets, and output offsets. Determining the respective sub-block error corrections terms may include multiplying the respective sub-block error detections codes by respective sums of (a) 2 raised to a power of a value of the respective input offsets and (b) 2 raised to a power of a value of the respective output offsets, and computing respective modulos of the respective multiplied values.

For some applications, the sub-blocks have respective input offsets within the input block, and determining the error correction term includes:

determining respective sub-block error correction terms for the sub-blocks by binary-shifting a value of each of the sub-blocks responsively to the respective input offsets, and computing respective modulos of the respective binary-shifted values; and combining the sub-block error correction terms to determine the error correction term.

Typically, the sub-blocks in the selected subset have respective output offsets within the output block, and determining the respective sub-block error correction terms for the sub-blocks in the subset includes binary-shifting a value of each of the sub-blocks responsively to the respective output offsets, and computing respective modulos of the respective binary-shifted values.

There is also provided, in accordance with an embodiment of the present invention, a method for error detection, including:

receiving a block of data having a modulo-based input error detection code and an error correction term appended thereto;

calculating an output error detection code of the block;

combining the input error detection code and the error correction term to produce a modified error detection code; and comparing the calculated error detection code to the modified error detection code so as to detect an error in the block.

Typically, combining the appended error detection code and the error correction term includes applying an XOR operation.

There is further provided, in accordance with an embodiment of the present invention, a method data processing, including:

receiving an input block of data together with a modulo-based input error detection code associated with the input block, the input block including a plurality of input sub-blocks;

generating one or more protocol-related sub-blocks to be incorporated together with the input sub-blocks in a specified order in an output block for conveyance to a destination processor;

determining an error correction term based on the specified order of the protocol-related sub-blocks and the input sub-blocks;

determining a modulo-based output error detection code responsively to the input error detection code and the error correction term; and concatenating the protocol-related sub-blocks, the input sub-blocks and the output error detection code to generate an output block for conveyance to a destination processor.

Typically, the error correction term is equal to a binary difference between the input error detection code and the output error detection code. Generally, at least one of the protocol-related sub-blocks includes a header, a marker, or padding. Typically, determining the output error detection code includes applying an XOR operation to the input error detection code and the error correction term.

For some applications, determining the error correction term includes processing the data in each of the protocol-related sub-blocks and the input sub-blocks so as to compute respective output sub-block error detection codes. Processing the data in each of the protocol-related sub-blocks and the input sub-blocks may include taking a modulo of the data. Taking the modulo may include computing the modulo with respect to a predetermined polynomial, so as to determine a cyclic redundancy code (CRC). Typically, computing the modulo includes using the predetermined polynomial that was applied in computing the input error detection code.

For some applications, determining the error correction term includes:

determining respective output offsets of the protocol-related sub-blocks and the input sub-blocks within the output block, responsively to the specified order;

determining respective sub-block error correction terms for the protocol-related sub-blocks and the input sub-blocks, responsively to the respective sub-block error detection codes and output offsets; and combining the sub-block error correction terms to determine the error correction term.

Determining the respective sub-block error correction terms may include binary-shifting the respective sub-block error detection codes by respective numbers of bits equal to the respective output offsets, and computing respective modulos of the respective shifted values.

Alternatively or additionally, the input sub-blocks have respective input offsets within the input block, and determining the respective sub-block error correction terms for the input sub-blocks includes determining the respective sub-block error correction terms responsively to the respective sub-block error detection codes, input offsets, and output offsets. Determining the respective sub-block error corrections terms may include multiplying the respective sub-block error detections codes by respective sums of (a) 2 raised to a power of a value of the respective input offsets and (b) 2 raised to a power of a value of the respective output offsets, and computing respective modulos of the respective multiplied values.

For some applications, determining the error correction term includes:

determining respective output offsets of the protocol-related sub-blocks and the input sub-blocks within the output block, responsively to the specified order;

determining respective sub-block error correction terms for the protocol-related sub-blocks and the input sub-blocks by binary-shifting a value of each of the protocol-related sub-blocks and the input sub-blocks responsively to the respective output offsets, and computing respective modulos of the respective binary-shifted values; and combining the sub-block error correction terms to determine the error correction term.

For some applications, the input sub-blocks have respective input offsets within the input block, and determining the respective sub-block error correction terms for the input sub-blocks includes binary-shifting a value of each of the input sub-blocks responsively to the respective input offsets, and computing respective modulos of the respective binary-shifted values.

There is still further provided, in accordance with an embodiment of the present invention, a protocol processor, including:

a receiving circuit, adapted to receive an input block of data together with a modulo-based input error detection code associated with the input block, the input block including a plurality of sub-blocks;

a parser, adapted to select a subset of the sub-blocks to be included in an output block;

a correction term calculator, adapted to determine an error correction term based on the selected subset; and an aggregator, adapted to concatenate the selected subset of the sub-blocks together with the input error detection code and the error correction term to generate an output block for conveyance to a destination processor.

There is additionally provided, in accordance with an embodiment of the present invention, a data receiver, including:

a receiving circuit, adapted to receive a block of data having a modulo-based input error detection code and an error correction term appended thereto; and an error detection circuit, which is coupled to compute an output error detection code of the block received by the receiving circuit, to combine the input error detection code and the error correction term to produce a modified error detection code, and to compare the calculated error detection code to the modified error detection code so as to detect an error in the block.

There is yet additionally provided, in accordance with an embodiment of the present invention, a computer system, including:

a protocol processor, which includes:

a receiving circuit, adapted to receive an input block of data together with a modulo-based input error detection code associated with the input block, the input block including a plurality of sub-blocks;

a parser, adapted to select a subset of the sub-blocks to be included in an output block;

a correction term calculator, adapted to determine an error correction term based on the selected subset; and an aggregator, adapted to concatenate the selected subset of the sub-blocks together with the input error detection code and the error correction term to generate an output block; and a destination processor, which is coupled to receive the output block from the protocol processor and to verify the data in the output block responsively to the input error detection code and the error correction term.

There is also provided, in accordance with an embodiment of the present invention, a protocol processor, including:

a receiving circuit, adapted to receive an input block of data together with a modulo-based input error detection code associated with the input block, the input block including a plurality of input sub-blocks;

a parser, adapted to generate one or more protocol-related sub-blocks to be incorporated together with the input sub-blocks in a specified order in an output block for conveyance to a destination processor;

a code calculator, adapted to determine an error correction term based on the specified order of the protocol-related sub-blocks and the input sub-block, and to determine a modulo-based output error detection code responsively to the input error detection code and the error correction term; and an aggregator, adapted to concatenate the protocol-related sub-blocks, the input sub-blocks and the output error detection code to generate an output block for conveyance to a destination processor.

There is further provided, in accordance with an embodiment of the present invention, a computer system, including:

a source processor, which is adapted to generate an input block of data, including a plurality of input sub-blocks, and to generate a modulo-based input error detection code for the input block; and a protocol processor, coupled to receive the input block together with the modulo-based input error detection code, and including:

a parser, adapted to generate one or more protocol-related sub-blocks to be incorporated together with the input sub-blocks in a specified order in an output block for conveyance to a destination processor;

a code calculator, adapted to determine an error correction term based on the specified order of the protocol-related sub-blocks and the input sub-blocks, and to determine a modulo-based output error detection code responsively to the input error detection code and the error correction term; and an aggregator, adapted to concatenate the protocol-related sub-blocks, the input sub-blocks and the output error detection code to generate an output block for conveyance to a destination processor.

There is still further provided, in accordance with an embodiment of the present invention, a computer software product for receiving data, the product including a computer-readable medium in which program instructions are stored, which instructions, when read by a computer, cause the computer to receive a block of data having a modulo-based input error detection code and an error correction term appended thereto, to compute an output error detection code of the block, to combine the input error detection code and the error correction term to produce a modified error detection code, and to compare the calculated error detection code to the modified error detection code so as to detect an error in the block.

The present invention will be more fully understood from the following detailed description of embodiments thereof, taken together with the drawings in which:

DETAILED DESCRIPTION OF EMBODIMENTS

Figure 1:
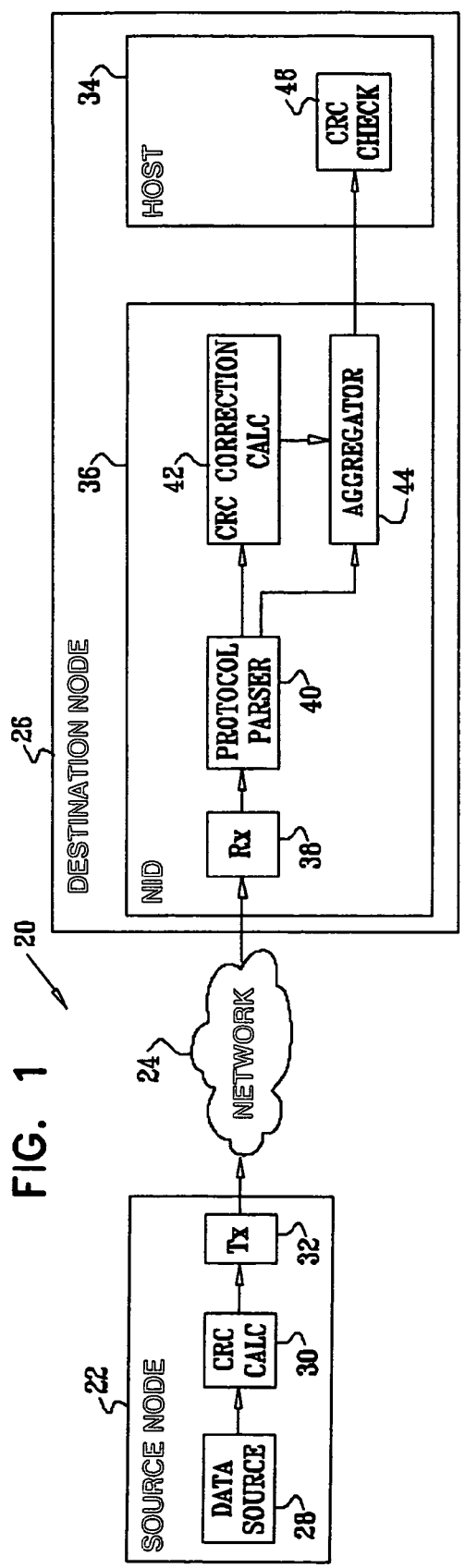
FIG. 1 is a block diagram that schematically illustrates a data communication system, in accordance with an embodiment of the present invention.

Reference is now made to FIG. 1, which is a block diagram that schematically illustrates a data communication system 20, in accordance with an embodiment of the present invention. A source node 22 conveys data blocks, typically packets, over a communications network 24 to a destination node 26. Source node 22 comprises a data source 28, typically an application running on the source node, a CRC calculator 30, and a transmit circuit 32. For each data block generated by data source 28, CRC calculator 30 calculates a CRC based on a predetermined polynomial g(X), as is known in the CRC art, and appends the CRC to the data block.

Destination node 26 comprises a host computer system 34 and a network interface device (NID) 36, which provides host 34 with an interface to network 24. Host 34 offloads a portion of protocol stack processing to NID 36. Although the NID is shown as a separate component of destination node 26, the NID may be implemented as a component of host 34, such as a network interface card (NIC). NID 36 comprises a receive circuit 38, which processes the input data blocks received from network 24, and passes the blocks to a protocol parser 40. Parser 40 terminates at least one protocol of the protocol stack. To terminate the protocol, parser 40 typically extracts and reorders sub-blocks of data from the input block, and removes protocol-related data, such as headers, markers, and padding, resulting in an output block at a higher protocol level.

Parser 40 typically does not use the received CRC to check the validity of the data of the input block. Instead, a CRC correction calculator 42 of NID 36 calculates an error correction term based on the relative positions of the sub-blocks in the input block and output block, as described hereinbelow with reference to FIGS. 2 and 3. An aggregator 44 of NID 36 appends the error correction term and the original CRC to the output block, and passes the output block to host 34. NID 36 thus passes the original CRC directly from the input block to the output block, without performing any computations on or with the original CRC. NID 36 typically does not use the original CRC to validate the integrity of the input block. Such direct passing of the original CRC generally reduces the likelihood of the original CRC being corrupted because of hardware or software errors. Alternatively, NID 36 uses the original CRC to validate the integrity of the input block, and discards the input block if the CRC check fails.

NID 36 typically carries out these function in dedicated hardware, such as a custom or programmable logic chip. Alternatively, the NID may perform some or all of these functions in software, which may be downloaded to the NID in electronic form over a network, for example, or it may alternatively be supplied on tangible media, such as CD-ROM.

Upon receiving the output block, a CRC check module 46 of host 34 determines whether to accept or reject the output block. CRC check module 46 calculates the CRC of the output block, as is known in the CRC art. The CRC check module combines the original error detection code of the input block with the error correction term, typically using an XOR operation. The CRC check module compares this combined value with the calculated CRC of the output block. A match indicates that the output block is valid, while a non-match generally indicates that the output block should be discarded. Typically, host 34 comprises a standard general-purpose processor with appropriate memory, communication interfaces and software for carrying out the CRC computations described herein. This software may be downloaded to the host in electronic form over a network, for example, or it may alternatively be supplied on tangible media, such as CD-ROM.

Figure 2:
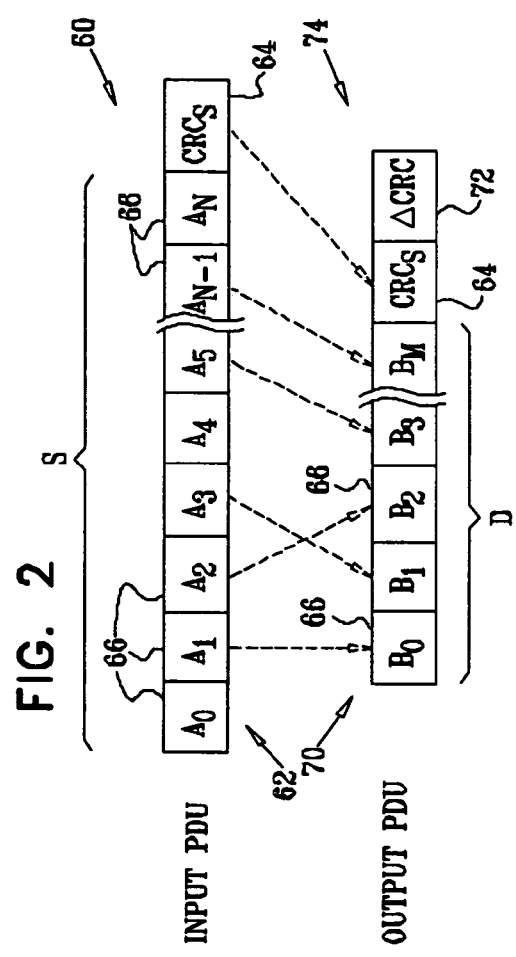
FIG. 2 is a block diagram that schematically illustrates the termination of an input Protocol Data Unit (PDU), in accordance with an embodiment of the present invention.

Reference is now made to FIG. 2, which is a block diagram that schematically illustrates the termination of an input Protocol Data Unit (PDU) 60, in accordance with an embodiment of the present invention. Input PDU 60 comprises an input block 62, labeled block S, and a $CRC_S$ 64, as calculated by CRC calculator 30 of source node 22. In order to process block S, protocol parser 40 divides block S into N+1 sub-blocks 66, labeled $A_0 \ldots A_N$, which may be of different sizes. Sub-blocks 66 represent protocol-specified data fields, such as payload, headers, markers, and padding. To generate a higher protocol level output block 70, labeled block D, parser 40 typically strips block S of a portion of the sub-blocks, and concatenates the remaining sub-blocks, not necessarily in their original order. The resulting block D comprises M+1 sub-blocks $B_0 \ldots B_M$, wherein M is less than N. In the example shown in FIG. 2, parser 40 strips sub-blocks $A_0$, $A_4$, and $A_N$ from block S, and reverses the order of blocks $A_2$ and $A_3$. Aggregator 44 appends to block D original $CRC_S$ 64 and an error correction term $\Delta CRC$ 72 (calculated as described hereinbelow with reference to FIG. 3), resulting in an output PDU 74, which NID 36 passes to host 34.

Figure 3:
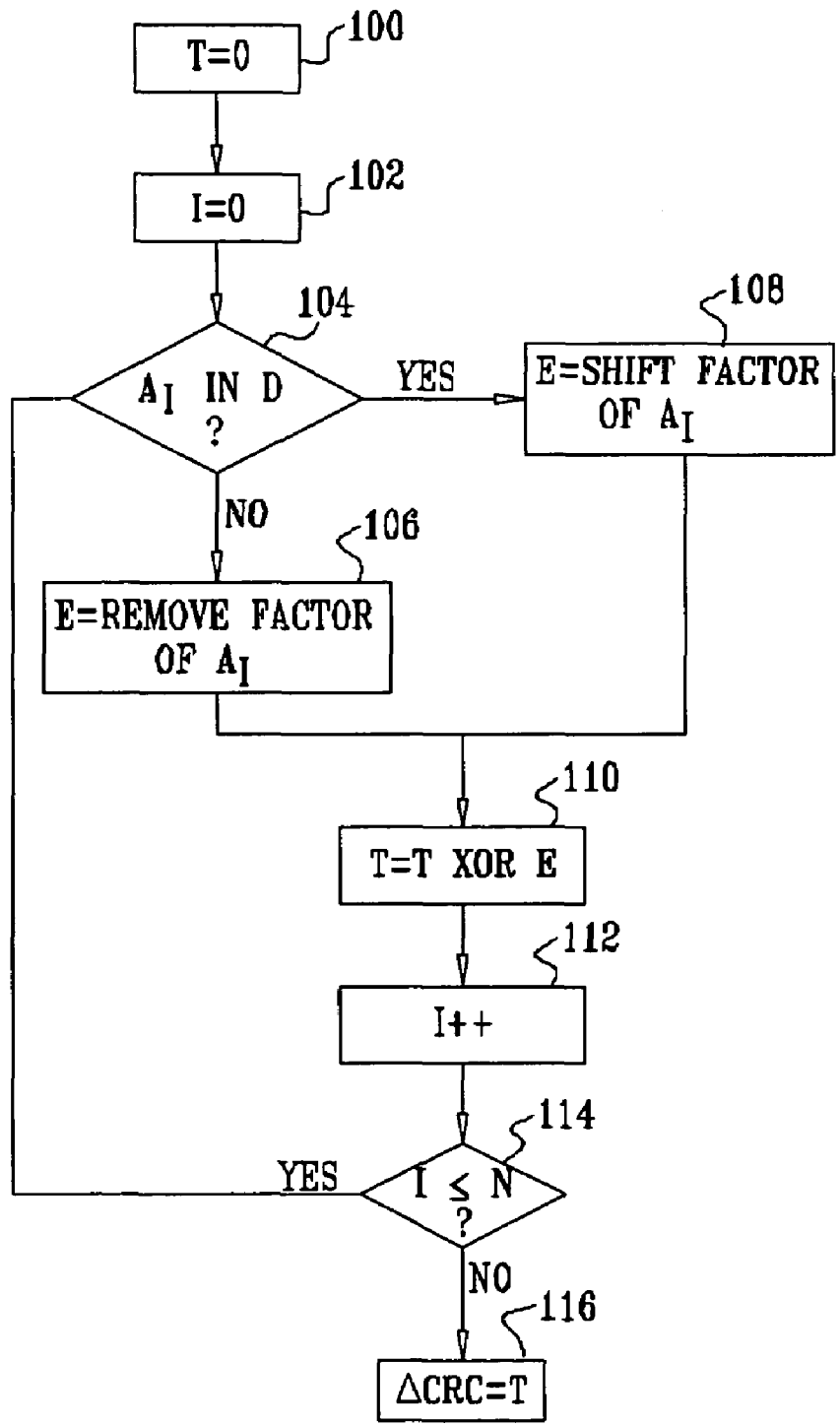
FIG. 3 is a flow chart schematically illustrating a method for calculating an error correction term for an input block, in accordance with an embodiment of the present invention.

FIG. 3 is a flow chart schematically illustrating a method for calculating error correction term 72, in accordance with an embodiment of the present invention. CRC correction calculator 42 begins the method by zeroing a correction term accumulator variable T, at a zero T step 100. Calculator 42 also zeroes a loop counter I, at a zero I step 102. Alternatively, calculator 42 uses other techniques for loop control, as will be apparent to those skilled in the art.

At an output block inclusion check step 104, calculator 42 checks whether sub-block $A_I$ is included in output block D. If calculator 42 finds that sub-block $A_I$ is not included in output block D, at a remove factor step 106 the calculator determines a temporary variable E using a remove factor defined as:

$$\text{Remove factor}(A_I, m) = (CRC(A_I) * X^m) \bmod g(X) \quad (1)$$
$$= (CRC(A_I) *$$
$$(X^m \bmod g(X))) \bmod g(X)$$

wherein $A_I$ is the sub-block being removed from block S, and m is the offset of the sub-block within the block, which offset is equal to the number of bits following the sub-block within the block. Calculator 42 uses the same primitive polynomial for this calculation as CRC calculator 30 used when calculating $CRC_S$ 64.

On the other hand, if the calculator finds that current sub-block $A_I$ is included in output block D, at a shift factor step 108 the calculator determines E using a shift factor defined as:

$$\text{Shift factor}(A_I, m, n) = (CRC(A_I) * (X^m + X^n)) \bmod g(X) \quad (2)$$
$$= (CRC(A_I) *$$
$$(X^m + X^n) \bmod g(X)) \bmod g(X)$$
$$= (CRC(A_I) * (X^m \bmod g(X) +$$
$$X^n \bmod g(X)) \bmod g(X))$$

wherein $A_I$ is the sub-block whose location is different in input block S than in output block D, m is the offset of $A_I$ within block S, and n is the offset of $A_I$ within block D. Calculator 42 uses the same primitive polynomial for this calculation as CRC calculator 30 used when calculating $CRC_S$ 64. If m equals n, calculator 42 sets E equal to 0.

In either case, calculator 42 accumulates the determined value of E by setting T equal to T XOR E, at an accumulation step 110. It is to be noted that there typically is no need to store the value of sub-block $A_I$ once temporary variable E has been calculated for $A_I$.

At an increment I step 112, the calculator increments I, and, if I is less than or equal to N (the highest-numbered sub-block in input block S), as determined at a loop check step 114, calculator 42 returns to step 104 for processing the next sub-block. Otherwise, the calculator concludes the method by setting error correction term $\Delta CRC$ 72 equal to T, at a set $\Delta CRC$ step 116.

A derivation of the remove and shift factors used at steps 106 and 108 is presented hereinbelow. Numerous equations mathematically equivalent to these factors will be apparent to those skilled in the art, upon reading the present patent application, and these equivalent equations are within the scope of the present invention. For the purposes of the present derivation, each input block S is represented as a polynomial $S(X) = s_0 + s_1 X + s_2 X^2 + \ldots$, wherein the coefficients $s_0, s_1, \ldots$, are the bits of the data block. When broken into sub-blocks $A_0, \ldots, A_N$, S(X) becomes $$S(X) = \sum_{I=0}^{S} A_I(X) \cdot X^{M_I},$$

wherein $M_I$ is the offset of each sub-block within block S, and the offset is equal to the number of bits following the sub-block within block S. $CRC_S$ (the CRC of the complete input block S) is given by:

$$CRC_S = S(X) \bmod g(X)$$

wherein g(X) is a primitive polynomial, and S(X) has been augmented by a number of 0 bits equal to the length of g(x) in bits, less 1.

Taking the simple case in which S is broken into three consecutive sub-blocks $A_0$, $A_1$, and $A_2$, and letting the notation CRC(A,m) represent the CRC of a data block A with m zeros appended thereto (i.e., block A binary shifted by m bits), it can be seen that $CRC_S$ may also be written as:

$$\begin{aligned}CRC_S &= CRC(A_0, m_1 + m_2) XOR \\ &\quad CRC(A_1, m_2) XOR\ CRC(A_2, 0) \\ &= (A_0(X) * X(m_1 + m_2)) \bmod g(X) XOR \\ &\quad (A_1(X) * X^m 2) \bmod g(X) XOR \\ &\quad A_2(X) \bmod g(X)\end{aligned} \quad (3)$$

wherein $m_i$ is the length in bits of sub-block $A_i$, and $A_i$ has been augmented by a number of 0 bits equal to the length of g(X), less 1. In other words, the CRC of a group of consecutive data blocks can be calculated by calculating the CRC of each data block separately while substituting zeros for the other blocks.

In these expressions, as well as in the description that follows, binary polynomial arithmetic is used, with no carries, as is known in the CRC art.

Equation (3) shows that if a sub-block is added to a data block after the CRC of the block has been calculated, the CRC can be modified to cover the bits of the additional sub-block by (a) appending the appropriate number of zeros to the additional sub-block, (b) calculating the CRC of the resulting binary-shifted sub-block, and (c) XORing the resulting sub-block CRC with the original CRC. Similarly, because addition and subtraction are equivalent in binary arithmetic using XOR operations, if a sub-block is removed from a block after the CRC of the block has been calculated, the CRC can be modified to exclude the bits of the removed sub-block using the same calculation as is used to add a sub-block. Therefore, the correction term of equation (1) for modifying a CRC of a block to remove a sub-block from the block is given by:

$$\begin{aligned}\text{Remove factor}(A_I, m) &= (A_I(X) * X^m) \bmod g(X) \\ &= (CRC(A_I) * X^m) \bmod g(X) \\ &= (CRC(A_I) * \\ &\quad (X^m \bmod g(X))) \bmod g(X)\end{aligned} \quad (4)$$

wherein $A_I$ is the sub-block being removed from the block, and m is the offset of the sub-block within the block, which offset is equal to the number of bits following the sub-block within the block. To correct the CRC of the complete block, the remove factor is XORed with the CRC. When calculator 42 uses equation (1) to calculate temporary variable E at step 106, as described hereinabove, $A_I$ is the sub-block not included in input block S.

Equation (3) also shows that if the location of a sub-block within a block is changed after the CRC of the block has been calculated, a compensating modification can be made to the CRC by removing the sub-block from its first location and adding the sub-block at its new location. Therefore, the correction term of equation (2) for modifying a CRC of a block to shift a sub-block within the block is given by:

$$\begin{aligned}\text{Shift factor}(A_I, m, n) &= (A_I(X) * X^m) \bmod g(X) XOR \\ &\quad (A_I(X) * X^n) \bmod g(X) \\ &= (CRC(A_I) * (X^m + X^n)) \bmod g(X) \\ &= (CRC(A_I) * \\ &\quad (X^m + X^n) \bmod g(X)) \bmod g(X) \\ &= (CRC(A_I) * (X^m \bmod g(X) + \\ &\quad X^n \bmod g(X)) \bmod g(X))\end{aligned} \quad (5)$$

wherein $A_I$ is the sub-block being shifted within the block, m is the offset of the original location of the sub-block within the block, and n is the offset of the new location of the sub-block within the block. To correct the CRC of the complete block, the shift factor is XORed with the CRC.

Figure 4:
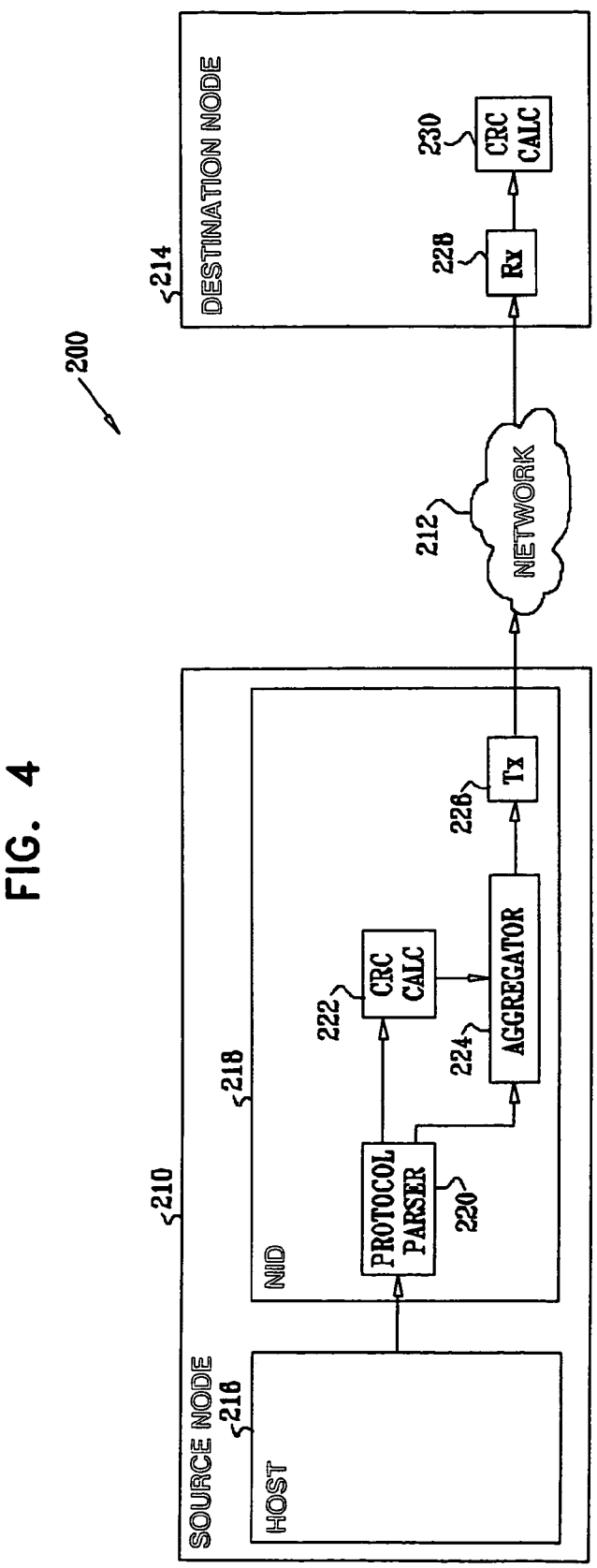
FIG. 4 is a block diagram that schematically illustrates a data communication system, in accordance with an embodiment of the present invention.

Reference is now made to FIG. 4, which is a block diagram that schematically illustrates a data communication system 200, in accordance with an embodiment of the present invention. A source node 210 conveys data blocks, typically packets, over a communications network 212 to a destination node 214. Source node 210 comprises a host 216, which generates the blocks of data, and offloads a portion of protocol stack processing to a NID 218. Typically, host 216 comprises a standard general-purpose processor with appropriate memory, communication interfaces and software for carrying out the CRC computations described herein. This software may be downloaded to the host in electronic form over a network, for example, or it may alternatively be supplied on tangible media, such as CD-ROM. Although NID 218 is shown as a separate component of source node 210, the NID may be implemented as a component of host 216, such as a network interface card (NIC).

NID 218 comprises a protocol parser 220, which terminates at least one protocol of the protocol stack. For each data block generated by host 216, a CRC calculator 222 of NID 218 calculates a CRC for at least one protocol, as described hereinbelow. An aggregator 224 of NID 218 appends the CRC to the data block, and a transmit circuit 226 of NID 218 sends the data block to network 212. NID 218 typically carries out these function in dedicated hardware, such as a custom or programmable logic chip. Alternatively, the NID may perform some or all of these functions in software, which may be downloaded to the NID in electronic form over a network, for example, or it may alternatively be supplied on tangible media, such as CD-ROM.

A receive circuit 228 of destination node 214 receives the data block from network 212, and passes it to a CRC check module 230. The CRC check module determines whether to accept or reject the block, by calculating the CRC of the block, as is known in the CRC art. For some applications, source node 210 sends data blocks to destination node 26, described with reference to FIG. 1.

Figure 5:
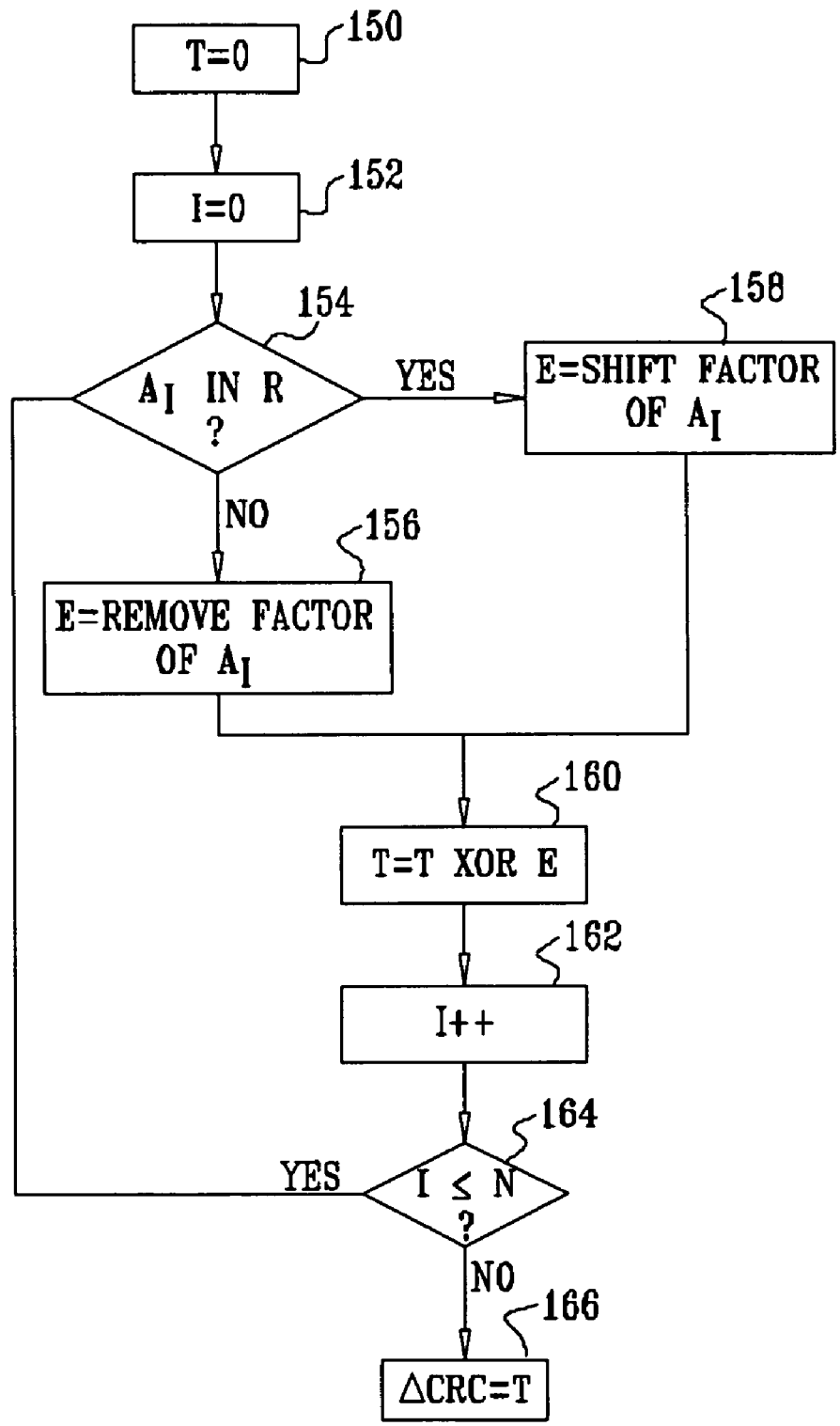
FIG. 5 is a flow chart schematically illustrating a method for calculating an error correction term for an output block assembled for transmission, in accordance with an embodiment of the present invention.

Reference is now made to FIG. 5, which is a flow chart schematically illustrating a method for calculating an error correction term ΔCRC for an output block V assembled for transmission, in accordance with an embodiment of the present invention. Host 216 generates a data block R for transmission, and calculates a $CRC_R$ for the block, using techniques known in the CRC art. The host appends the $CRC_R$ to block R, and passes block R to NID 218. (Block R is referred herein to as input block R with respect to the NID.) Protocol parser 220 of NID 218 assembles lower protocol level output data block V by dividing input block R into sub-blocks, and interspersing additional sub-blocks containing protocol-related data, such as headers, markers, and padding. The resulting output data block V has N+1 sub-blocks $A_0, \ldots, A_N$.

To compute $CRC_V$ for output block V, CRC calculator 222 of NID 218 calculates an error correction term ΔCRC based on the positions of the sub-blocks in output block V relative to their respective positions in input block R, as described immediately hereinbelow. The NID applies ΔCRC to $CRC_R$, typically using an XOR operation, in order to produce $CRC_V$. Aggregator 224 of NID 218 appends $CRC_V$ to the output block, and passes the output block to network 212.

CRC calculator 222 begins the ΔCRC calculation method by zeroing a correction term accumulator variable T, at a zero T step 150. Calculator 222 also zeroes a loop counter I, at a zero I step 152. Alternatively, calculator 222 uses other techniques for loop control, as will be apparent to those skilled in the art.

At an input block inclusion check step 154, calculator 222 checks whether sub-block $A_I$ is included in input block R. If calculator 222 finds that the sub-block is not included in input block R, the calculator determines a temporary variable E using remove factor equation (1), as described hereinabove, at a remove factor step 156, setting m to be the offset of sub-block $A_I$ within output block V. Calculator 222 uses the same primitive polynomial for this calculation as host 34 used when calculating $CRC_R$. Calculator 222 is able to use the remove factor equation to add a sub-block because, as described hereinabove, addition and subtraction are equivalent in binary XOR arithmetic.

On the other hand, if at step 154 the calculator finds that sub-block $A_I$ is included in input block R, calculator 222 determines E using shift factor equation (2), as described hereinabove, at a shift factor step 158. In this case, m is the offset of sub-block $A_I$ within input block R, and n is the offset of $A_I$ within output block V.

After calculating E, whether at step 156 or 158, calculator 222 accumulates the determined value of E by setting T equal to T XOR E, at an accumulation step 160. At an increment I step 162, the calculator increments I. If I is less than or equal to N (the highest-numbered sub-block in output block V), as determined at a loop check step 164, calculator 222 returns to step 164 for processing the next sub-block. Otherwise, the calculator concludes the method by setting error correction term ΔCRC equal to T, at a set ΔCRC step 166.

In an embodiment of the present invention, calculator 42 and/or 222 uses the following code for calculating $X^M$ mod g(X). The calculator typically uses this code for calculating $X^m$ mod g(X) and $X^{m+n}$ mod g(X) of equations (1) and (2), respectively. In this code, $m_{L-1}m_{L-2} \ldots m_1m_0$ is the L-bit representation of M.

$T(X) = 1;$

For $(j = 0; j < L; j++)$

{

$A(X) = X^{\wedge}2^j$ mod $g(X)$; /* get value from a table */

If $(m_j == 1)$ $T(X) = T(X) * A(X)$ mod $g(X)$;

/* polynomial multiplication */

}

To execute the code, NID 36 or 218 provides a table containing the polynomials $X^{\wedge}2^j$ mod g(X) for j=0, 1, ..., k, wherein $2^{k+1}-1$ is the maximum expected packet length. Polynomial multiplication may be implemented using techniques described with reference to FIG. 5 of the above-mentioned U.S. Patent Application Publication 2003/0066011 (the '011 application). In order to implement these techniques in hardware, an equation generator is typically used, which describes (a) the future state of each memory element in FIG. 5 of the '011 application, given the present state of the rest of the elements, (b) the value of the coefficients of the polynomial P, and (c) the N current bits of the polynomial Q. Appendix A presents exemplary MATLAB code for such an equation generator.

In an embodiment of the present invention, calculator 42 or 222 implements a table-based CRC calculator, for example as described with reference to FIG. 2 of the '011 application. These techniques may be implemented in hardware in a ROM table, via a combinatorial network defined by a set of equations which describe the future state of each storage element, given its current state and the N input bits. Appendix B presents exemplary MATLAB code for such an equation generator.

The equation generators of Appendix A and B are implemented as production rule grammars. Each of the character string variables S0, S1, . . . contains a string describing the content of the storage elements it represents, as a function of its previous state and the input sequence. The variables S0, S1, . . . are initialized to the strings s0(t-1), s1(t-1), . . . , respectively. The variable I represents the system input, and sequences the string values i0, i1, i2 . . . once per each clock. The system state evolves using production rules. For example, the state of storage element S0 may be determined by the production rule S0→S15 ^ I, so that the string content of S0 is replaced by the string which is a concatenation of the strings for S15 with the string ^ (XOR) and with the string contained in I representing the current input. The production system is implemented with the MATLAB function sprintf, which performs the string manipulation. The taps of the multiplier polynomial are represented by the constants p0, p1, . . . , which are built into the production rules. Since it is generally not possible in MATLAB to have a two dimensional array of variable length strings, the main data structure ss[ ] is a vector that stores, in a concatenated form, all of the strings representing S0, S1, . . . The matrix b[:, :] is used to determine the boundaries of each string. The string Sj occupies the substring of ss starting in b[j, 1] and ending in b[j, 2].

Appendix C presents an exemplary implementation of several calculations performed by calculator 42 or 222 in MATLAB code, in accordance with an embodiment of the present invention. The MATLAB implementation includes the following files:

block_crc—calculates the CRC of a block of data
crc_m—implements the procedure CRC_REMOVE
crc_m_n—implements the procedure CRC_SHIFT mult_mod—implements polynomial multiplication
exp_mod—implements $X^M$ mode g(X)

Other implementations of the CRC arithmetic necessary for carrying out the methods described above will be apparent to those skilled in the art and are considered to be within the scope of the present invention.

Although the embodiments described hereinabove refer specifically to certain communication protocols, such as TCP/IP, and types of error detecting codes, such as CRCs, the principles of the present invention may similarly be applied to data communications using other protocols, which may use error detecting codes of other types. The advantages of the present invention in the context of other protocols, coding algorithms and applications will be apparent to those skilled in the art.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

APPENDIX A

EQUATION GENERATOR FOR FINITE-FIELD MULTIPLIER

```
M = 8;    % Number of input bits per clock cycle
N = 16;   % Number of stages in the LFSR
% feedback polynomial definitions
a = [1 2];   % nonzero feedback taps 1 = g(0), 2 = g(1)
% calculate feedback polynomial
g = [zeros(1,N) 1];
g(a) = ones(size(a));
% initialize data structures
ss = [ ];
sst = [ ];
b = zeros(N,2);
bt = zeros(N,2);
I = 'i0';
for i=1:N,
    s = sprintf('s%d(t-1)', i-1);
    b(i,1) = length(ss)+1; % location of first char
    b(i,2) = b(i,1) + length(s) - 1; % location of last char
    ss = [ss s];
end;
% Equation calculation loop
for i = 1:M,   % iterate over number of bits
% tap s0
    if g(1) == 1,
        s = sprintf('%s ^ p0*%s',ss(b(N,1):b(N,2)),I);
    else
        s = sprintf('p0*%s',I);
    end
    sst  = s;
    bt(1,1) = 1;
    bt(1,2) = bt(1,1) + length(s) - 1;
% rest of taps
    for j = 2:N, % loop over other taps
        if g(j) == 1,
            s = sprintf('%s ^ %s', ss(b(N,1):b(N,2)),ss (b(j-1,1):b(j-1,2)));
        else
            s = sprintf('%s',ss(b(j-1,1):b(j-1,2)));
        end
        s = sprintf('%s ^ p%d*%s',s,j-1,I);
                    % concatenate
                    multiplier term
        bt(j,1) = length(sst) + 1;
        bt(j,2) = bt(j,1) + length(s) - 1;
        sst  = [sst s];
```

APPENDIX A-continued

EQUATION GENERATOR FOR FINITE-FIELD MULTIPLIER

```
end;
% bit loop house keeping
    ss = sst;
    b = bt;
    I = sprintf('i%d',i);
% debug info
%      fprintf(1,'\n');
%      for k=1:N,
%          fprintf(1,'s%d(t) = %s\n',k-1,ss(b(k,1):b(k,2)));
%      end;
end;
% print report
fprintf(1,'equation report:\n');
fprintf(1,'================\n')
fprintf(1,'Number of FFs in LFSR: %d \n', N);
fprintf(1,'Number of input bits/cycle: %d\n',M);
fprintf(1,'Feedback Polynomial: ');
for j=N+1:-1:2,
    if g(j) == 1,
        fprintf(1,'X^%d + ',j-1);
    end;
end;
    if g(1) == 1,
        fprintf(1,'1');
    end;
end;
fprintf(1, '\n\n');
for i=1:N,
    fprintf(1,'s%d(t) = %s\n',i-1,ss(b(i,1):b(i,2)));
end;
```

APPENDIX B

EQUATION GENERATOR FOR MULTI-BIT CRC

```
% Input Variables
M = 8;    % Number of input bits per clock cycle
N = 16;   % Number of stages in the LFSR
a = [1 2];   % index of nonzero feedback taps, 1 = g(0)
2 = g(1) etc.
% calculate feedback polynomial
g = [zeros(1,N) 1];
g(a) = ones(size(a));
% initialize data structures
%
ss = [ ];
sst = [ ];
b = zeros(N,2);
bt = zeros(N,2);
% initialize input string
I = 'i0';
% initialize storage elements S0, S1 . . . to s0(t-1),
s1(t-1) . . .
for i=1:N,
    s = sprintf('s%d(t-1)',i-1);
    b(i,1) = length(ss)+1;   % location of first char
    b(i,2) = b(i,1) + length(s) - 1;
                                    %
                                    location
                                    of
                                    last
                                    char
    ss = [ss s];
end;
% Equation calculation loop
% iterate production grammar
for i = 1:M,   % iterate over number of bits
% tap s0
    if g(1) == 1,
        s = sprintf('%s ^ %s',ss(b(N,1):b(N,2)),I);
    else
        s = sprintf('%s',I);
    end
```

APPENDIX B-continued

EQUATION GENERATOR FOR MULTI-BIT CRC

```
        sst = s;
        bt(1,1) = 1;
        bt(1,2) = bt(1,1) + length(s) - 1;
% rest of taps
        for j = 2:N, % loop over other taps
            if g(j) == 1,
                s = sprintf('%s^
%s',ss(b(N,1):b(N,2)),ss(b(j-1,1):b(j-1,2)));
            else
                s = sprintf('%s',ss(b(j-1,1):b(j-1,2)));
            end
            bt(j,1) = length(sst) + 1;
            bt(j,2) = bt(j,1) + length(s) - 1;
            sst    = [sst s];
        end;
% bit loop house keeping
        ss = sst;
        b = bt;
        I = sprintf('i%d',i);
% debug info
%       fprintf(1,'\n');
%       for k=1:N,
%           fprintf(1,'s%d(t) = %s\n',k-1,ss(b(k,1):b(k,2)));
%       end;
end;
% print report
fprintf(1,'equation report:\n');
fprintf(1,'===============\n');
fprintf(1,'Number of FFs in LFSR: %d \n', N);
fprintf(1,'Number of input bits/cycle: %d\n',M);
fprintf(1,'Feedback Polynomial: ');
for j=N+1:-1:2,
    if g(j) == 1,
        fprintf(1,'X^%d + ',j-1);
    end;
end;
    if g(1) == 1,
        fprintf(1,'1');
    end;
fprintf(1, '\n\n');
% print equations
for i=1:N,
    fprintf(1,'s%d(t) = %s\n',i-1,ss(b(i,1):b(i,2)));
end;
```

APPENDIX C

MATLAB IMPLEMENTATION OF CALCULATIONS

```
G   = [1 0 0 1 1];    % g(x) = x^4 + x + 1
D0 = [0 1 2 3];        % block of bytes
M  = [215 255];        % Marker
D1 = [4 5 6 7 8 9];    % block of bytes
P  = [0 0 0];          % padding
MPA_CRC = block_crc([D0 M D1 P], G);
OUT_CRC = block_crc([D0 D1], G);
% calculation of the correction term
N = length(G) - 1;
COR = zeros(size(1:N)); % initialize correction term to zero
COR = xor(COR, crc_m_n(D0,  length([M D1 P])*8,
    length(D1)*8, G)); % appears in output
COR = xor(COR,  crc_m(M,  length([D1 P])*8,   0,
                G)); % does not appear in output
COR = xor(COR, crc_m_n(D1,  length(P)*8,    0,
                G)); % appears in output
MPA_CRC
OUT_CRC
COR_CRC = xor(COR, MPA_CRC)
function R = block_crc(B,G)
% This function calculates the CRC of a block of data
% Parameters:
% B - an array of bytes to be processed
```

APPENDIX C-continued

MATLAB IMPLEMENTATION OF CALCULATIONS

```
% G - CRC polynomial
% LFSR Initialization
N = length(G)-1; % shift register length
Sreg     = zeros(size(1:N));
% Calculate CRC of data block B
for i=1:length(B),
    a = dec2bin(B(i),8); % a is a string !
    for j=1:8,
        Sreg = [Sreg bin2dec(a(j))]; % the bin2dec is
% required because a(j) is a string not a number
        if Sreg(1) == 1,
            Sreg = xor(G, Sreg);
        end;
        Sreg = Sreg(2:N+1);    % Shift left
    end;
end;
R = Sreg;
function R = crc_m(B,M,N,G)
% This function calculates the CRC of block B and applies
% a correction factor that compensates
% for the shifting of the block from original position M
% to position N.
crc = block_crc(B,G);
a = exp_mod(M,G);
R = mult_mod(crc,a,G);
function R = crc_m_n(B,M,N,G)
% This function calculates the CRC of block B and applies
% a correction factor that compensates
% for the shifting of the block from original position M
% to position N.
crc = block_crc(B,G);
a = xor(exp_mod(M,G), exp_mod(N,G));
R = mult_mod(crc,a,G);
function R = mult_mod(P,Q,G)
% This function calculates P(x)*Q(x) mod G(x)
N = length(G)-1;    % shift register length
% LFSR Initialization
Sreg     = zeros(size(1:N));
% Feed in Q one bit at a time
for i=1:length(P),
    Sreg = [Sreg 0];
    if Q(i) == 1,
        Sreg = xor([0 P], Sreg);
    end;
    if Sreg(1) == 1,
        Sreg = xor(G, Sreg);
    end;
    Sreg = Sreg(2:N+1);     % Shift left
end;
R = Sreg;
function R = exp_mod (M,G)
% This function calculates x^M mod G(x)
% In practical implementations this will be implemented
% with a table
% that contains the entries X^(2^i) mod g(X)
% for i = 0,1,2,3,4,5 ... 16
% or if the positions are byte aligned for
% i =3,4,5,6 ... 16
a = fliplr(dec2bin(M));
N = length(G)-1;    % shift register length
% initialize X^1
X = zeros(size(1:N));
X(N-1) = 1;
R = zeros(size(1:N)); % R = 1 in case M = 0
R(N) = 1;
if M > 0,
    for i=1:length(a),
        if a(i) == '1',
            R = mult_mod(R,X,G);
        end;
        X = mult_mod(X,X,G);    % should come from a table
    end;
end;
```

The invention claimed is:

1. A method for data verification, comprising:
receiving an input block of data together with a modulo-based input error detection code associated with the input block, the input block comprising a plurality of sub-blocks;
selecting a subset of the sub-blocks to be included in an output block;
determining an error correction term based on the selected subset; and
concatenating the selected subset of the sub-blocks together with the input error detection code and the error correction term to generate an output block for conveyance to a destination processor.

2. The method according to claim 1, wherein the error correction term is equal to a binary difference between the input error detection code and an output error detection code of the output block.

3. The method according to claim 1, wherein selecting the subset comprises determining an order of the sub-blocks in the output block, and wherein determining the error correction term comprises determining the error correction term responsively to the order.

4. The method according to claim 1, and comprising, upon receipt of the output block at the destination processor, determining whether to accept or reject the output block by computing an output error detection code of the output block, and comparing the output error detection code to the input error detection code and the error correction term.

5. The method according to claim 4, wherein comparing the output error detection code comprises applying an XOR operation to the input error detection code and the error correction term.

6. The method according to claim 1, wherein determining the error correction term comprises processing data in each of the sub-blocks so as to compute respective sub-block error detection codes.

7. The method according to claim 6, wherein processing the data in each of the sub-blocks comprises taking a modulo of the data.

8. The method according to claim 7, wherein taking the modulo comprises computing the modulo with respect to a predetermined polynomial, so as to determine a cyclic redundancy code (CRC) of the sub-block.

9. The method according to claim 8, wherein computing the modulo comprises using the predetermined polynomial that was applied in computing the input error detection code.

10. The method according to claim 6, wherein the sub-blocks have respective input offsets within the input block, and wherein determining the error correction term comprises:
determining respective sub-block error correction terms for the sub-blocks, responsively to the respective sub-block error detection codes and input offsets; and
combining the sub-block error correction terms to determine the error correction term.

11. The method according to claim 10, wherein determining the respective sub-block error correction terms comprises binary-shifting the respective sub-block error detection codes by respective numbers of bits equal to the respective input offsets, and computing respective modulos of the respective shifted values.

12. The method according to claim 10, wherein the sub-blocks in the selected subset have respective output offsets within the output block, and wherein determining the respective sub-block error correction terms for the sub-blocks in the subset comprises determining the respective sub-block error correction terms responsively to the respective sub-block error detection codes, input offsets, and output offsets.

13. The method according to claim 12, wherein determining the respective sub-block error corrections terms comprises multiplying the respective sub-block error detections codes by respective sums of (a) 2 raised to a power of a value of the respective input offsets and (b) 2 raised to a power of a value of the respective output offsets, and computing respective modulos of the respective multiplied values.

14. The method according to claim 1, wherein the sub-blocks have respective input offsets within the input block, and wherein determining the error correction term comprises:
determining respective sub-block error correction terms for the sub-blocks by binary-shifting a value of each of the sub-blocks responsively to the respective input offsets, and computing respective modulos of the respective binary-shifted values; and
combining the sub-block error correction terms to determine the error correction term.

15. The method according to claim 14, wherein the sub-blocks in the selected subset have respective output offsets within the output block, and wherein determining the respective sub-block error correction terms for the sub-blocks in the subset comprises binary-shifting a value of each of the sub-blocks responsively to the respective output offsets, and computing respective modulos of the respective binary-shifted values.

16. A method for data processing, comprising:
receiving an input block of data together with a modulo-based input error detection code associated with the input block, the input block comprising a plurality of input sub-blocks;
generating one or more protocol-related sub-blocks to be incorporated together with the input sub-blocks in a specified order in an output block for conveyance to a destination processor;
determining an error correction term based on the specified order of the protocol-related sub-blocks and the input sub-blocks;
determining a modulo-based output error detection code responsively to the input error detection code and the error correction term; and
concatenating the protocol-related sub-blocks, the input sub-blocks and the output error detection code to generate an output block for conveyance to a destination processor.

17. The method according to claim 16, wherein the error correction term is equal to a binary difference between the input error detection code and the output error detection code.

18. The method according to claim 16, wherein at least one of the protocol-related sub-blocks comprises a header, a marker, or padding.

19. The method according to claim 16, wherein determining the output error detection code comprises applying an XOR operation to the input error detection code and the error correction term.

20. The method according to claim 16, wherein determining the error correction term comprises processing the data in each of the protocol-related sub-blocks and the input sub-blocks so as to compute respective output sub-block error detection codes.

21. The method according to claim 20, wherein processing the data in each of the protocol-related sub-blocks and the input sub-blocks comprises taking a modulo of the data.

22. The method according to claim 21, wherein taking the modulo comprises computing the modulo with respect to a predetermined polynomial, so as to determine a cyclic redundancy code (CRC).

23. The method according to claim 22, wherein computing the modulo comprises using the predetermined polynomial that was applied in computing the input error detection code.

24. The method according to claim 20, wherein determining the error correction term comprises:
determining respective output offsets of the protocol-related sub-blocks and the input sub-blocks within the output block, responsively to the specified order;
determining respective sub-block error correction terms for the protocol-related sub-blocks and the input sub-blocks, responsively to the respective sub-block error detection codes and output offsets; and
combining the sub-block error correction terms to determine the error correction term.

25. The method according to claim 24, wherein determining the respective sub-block error correction terms comprises binary-shifting the respective sub-block error detection codes by respective numbers of bits equal to the respective output offsets, and computing respective modulos of the respective shifted values.

26. The method according to claim 24, wherein the input sub-blocks have respective input offsets within the input block, and wherein determining the respective sub-block error correction terms for the input sub-blocks comprises determining the respective sub-block error correction terms responsively to the respective sub-block error detection codes, input offsets, and output offsets.

27. The method according to claim 26, wherein determining the respective sub-block error corrections terms comprises multiplying the respective sub-block error detections codes by respective sums of (a) 2 raised to a power of a value of the respective input offsets and (b) 2 raised to a power of a value of the respective output offsets, and computing respective modulos of the respective multiplied values.

28. The method according to claim 16, wherein determining the error correction term comprises:
determining respective output offsets of the protocol-related sub-blocks and the input sub-blocks within the output block, responsively to the specified order;
determining respective sub-block error correction terms for the protocol-related sub-blocks and the input sub-blocks by binary-shifting a value of each of the protocol-related sub-blocks and the input sub-blocks responsively to the respective output offsets, and computing respective modulos of the respective binary-shifted values; and
combining the sub-block error correction terms to determine the error correction term.

29. The method according to claim 28, wherein the input sub-blocks have respective input offsets within the input block, and wherein determining the respective sub-block error correction terms for the input sub-blocks comprises binary-shifting a value of each of the input sub-blocks responsively to the respective input offsets, and computing respective modulos of the respective binary-shifted values.

30. A protocol processor, comprising:
a receiving circuit, adapted to receive an input block of data together with a modulo-based input error detection code associated with the input block, the input block comprising a plurality of sub-blocks;
a parser, adapted to select a subset of the sub-blocks to be included in an output block;
a correction term calculator, adapted to determine an error correction term based on the selected subset; and
an aggregator, adapted to concatenate the selected subset of the sub-blocks together with the input error detection code and the error correction term to generate an output block for conveyance to a destination processor.

31. The processor according to claim 30, wherein the error correction term is equal to a binary difference between the input error detection code and an output error detection code of the output block.

32. The processor according to claim 30, wherein the parser is adapted to determine an order of the sub-blocks in the output block, and wherein the correction term calculator is adapted to determine the error correction term responsively to the order.

33. The processor according to claim 30, wherein the correction term calculator is adapted to process data in each of the sub-blocks so as to compute respective sub-block error detection codes.

34. The processor according to claim 33, wherein the correction term calculator is adapted to process the data in each of the sub-blocks by taking a modulo of the data.

35. The processor according to claim 34, wherein the correction term calculator is adapted to take the modulo by computing the modulo with respect to a predetermined polynomial, so as to determine a cyclic redundancy code (CRC) of the sub-block.

36. The processor according to claim 35, wherein the correction term calculator is adapted to compute the modulo using the predetermined polynomial that was applied in computing the input error detection code.

37. The processor according to claim 33, wherein the sub-blocks have respective input offsets within the input block, and wherein the correction term calculator is adapted to determine the error correction term by determining respective sub-block error correction terms for the sub-blocks, responsively to the respective sub-block error detection codes and input offsets, and combining the sub-block error correction terms to determine the error correction term.

38. The processor according to claim 37, wherein the correction term calculator is adapted to determine the respective sub-block error correction terms by binary-shifting the respective sub-block error detection codes by respective numbers of bits equal to the respective input offsets, and computing respective modulos of the respective shifted values.

39. The processor according to claim 37, wherein the sub-blocks in the selected subset have respective output offsets within the output block, and wherein the correction term calculator is adapted to determine the respective sub-block error correction terms for the sub-blocks in the subset by determining the respective sub-block error correction terms responsively to the respective sub-block error detection codes, input offsets, and output offsets.

40. The processor according to claim 39, wherein the correction term calculator is adapted to determine the respective sub-block error corrections terms by multiplying the respective sub-block error detections codes by respective sums of (a) 2 raised to a power of a value of the respective input offsets and (b) 2 raised to a power of a value of the respective output offsets, and computing respective modulos of the respective multiplied values.

41. The processor according to claim 30, wherein the sub-blocks have respective input offsets within the input block, and wherein the correction term calculator is adapted to determine the error correction term by determining respective sub-block error correction terms for the sub-blocks by binary-shifting a value of each of the sub-blocks responsively to the respective input offsets, computing respective modulos of the respective binary-shifted values, and combining the sub-block error correction terms to determine the error correction term.

42. The processor according to claim 41, wherein the sub-blocks in the selected subset have respective output offsets within the output block, and wherein the correction term calculator is adapted to determine the respective sub-block error correction terms for the sub-blocks in the subset by binary-shifting a value of each of the sub-blocks responsively to the respective output offsets, and computing respective modulos of the respective binary-shifted values.

43. A computer system, comprising:
a protocol processor, which comprises:
   a receiving circuit, adapted to receive an input block of data together with a modulo-based input error detection code associated with the input block, the input block comprising a plurality of sub-blocks;
   a parser, adapted to select a subset of the sub-blocks to be included in an output block;
   a correction term calculator, adapted to determine an error correction term based on the selected subset; and
   an aggregator, adapted to concatenate the selected subset of the sub-blocks together with the input error detection code and the error correction term to generate an output block; and
a destination processor, which is coupled to receive the output block from the protocol processor and to verify the data in the output block responsively to the input error detection code and the error correction term.

44. The system according to claim 43, wherein the destination processor is adapted to determine whether to accept or reject the output block by computing an output error detection code of the output block, and comparing the output error detection code to the input error detection code and the error correction term.

45. The system according to claim 44, wherein the destination processor is adapted to compare the output error detection code by applying an XOR operation to the input error detection code and the error correction term.

46. The system according to claim 43, wherein the error correction term is equal to a binary difference between the input error detection code and an output error detection code of the output block.

47. The system according to claim 43, wherein the parser is adapted to determine an order of the sub-blocks in the output block, and wherein the correction term calculator is adapted to determine the error correction term responsively to the order.

48. The system according to claim 43, wherein the correction term calculator is adapted to process data in each of the sub-blocks so as to compute respective sub-block error detection codes.

49. A protocol processor, comprising:
a receiving circuit, adapted to receive an input block of data together with a modulo-based input error detection code associated with the input block, the input block comprising a plurality of input sub-blocks;
a parser, adapted to generate one or more protocol-related sub-blocks to be incorporated together with the input sub-blocks in a specified order in an output block for conveyance to a destination processor;
a code calculator, adapted to determine an error correction term based on the specified order of the protocol-related sub-blocks and the input sub-block, and to determine a modulo-based output error detection code responsively to the input error detection code and the error correction term; and
an aggregator, adapted to concatenate the protocol-related sub-blocks, the input sub-blocks and the output error detection code to generate an output block for conveyance to a destination processor.

50. The processor according to claim 49, wherein the error correction term is equal to a binary difference between the input error detection code and the output error detection code.

51. The processor according to claim 49, wherein at least one of the protocol-related sub-blocks comprises a header, a marker, or padding.

52. The processor according to claim 49, wherein the code calculator is adapted to determine the output error detection code by applying an XOR operation to the input error detection code and the error correction term.

53. The processor according to claim 49, wherein the code calculator is adapted to determine the error correction term by processing the data in each of the protocol-related sub-blocks and the input sub-blocks so as to compute respective output sub-block error detection codes.

54. The processor according to claim 53, wherein the code calculator is adapted to process the data in each of the protocol-related sub-blocks and the input sub-blocks by taking a modulo of the data.

55. The processor according to claim 54, wherein the code calculator is adapted to take the modulo by computing the modulo with respect to a predetermined polynomial, so as to determine a cyclic redundancy code (CRC).

56. The processor according to claim 55, wherein the code calculator is adapted to compute the modulo by using the predetermined polynomial that was applied in computing the input error detection code.

57. The processor according to claim 56, wherein the code calculator is adapted to determine the correction term by:
   determining respective output offsets of the protocol-related sub-blocks and the input sub-blocks within the output block,
   determining respective sub-block error correction terms for the protocol-related sub-blocks and the input sub-blocks, responsively to the respective sub-block error detection codes and output offsets, and
   combining the sub-block error correction terms to determine the error correction term.

58. The processor according to claim 57, wherein the code calculator is adapted to determine the respective sub-block error correction terms by binary-shifting the respective sub-block error detection codes by respective numbers of bits equal to the respective output offsets, and computing respective modulos of the respective shifted values.

59. The processor according to claim 57, wherein the input sub-blocks have respective input offsets within the input block, and wherein the code calculator is adapted to determine the respective sub-block error correction terms for the input sub-blocks by determining the respective sub-block error correction terms responsively to the respective sub-block error detection codes, input offsets, and output offsets.

60. The processor according to claim 59, wherein the code calculator is adapted to determine the respective sub-block error corrections terms by multiplying the respective sub-block error detections codes by respective sums of (a) 2 raised to a power of a value of the respective input offsets and (b) 2 raised to a power of a value of the respective output offsets, and computing respective modulos of the respective multiplied values.

61. The processor according to claim 49, wherein the code calculator is adapted to determine the error correction term by:
   determining respective output offsets of the protocol-related sub-blocks and the input sub-blocks within the output block, responsively to the specified order,
   determining respective sub-block error correction terms for the protocol-related sub-blocks and the input sub-blocks by binary-shifting a value of each of the protocol-related sub-blocks and the input sub-blocks responsively to the respective output offsets, and computing respective modulos of the respective binary-shifted values, and
   combining the sub-block error correction terms to determine the error correction term.

62. The processor according to claim 61, wherein the input sub-blocks have respective input offsets within the input block, and wherein the code calculator is adapted to determine the respective sub-block error correction terms for the input sub-blocks by binary-shifting a value of each of the input sub-blocks responsively to the respective input offsets, and computing respective modulos of the respective binary-shifted values.

63. A computer system, comprising:
   a source processor, which is adapted to generate an input block of data, comprising a plurality of input sub-blocks, and to generate a modulo-based input error detection code for the input block; and
   a protocol processor, coupled to receive the input block together with the modulo-based input error detection code, and comprising:
      a parser, adapted to generate one or more protocol-related sub-blocks to be incorporated together with the input sub-blocks in a specified order in an output block for conveyance to a destination processor;
      a code calculator, adapted to determine an error correction term based on the specified order of the protocol-related sub-blocks and the input sub-blocks, and to determine a modulo-based output error detection code responsively to the input error detection code and the error correction term; and
      an aggregator, adapted to concatenate the protocol-related sub-blocks, the input sub-blocks and the output error detection code to generate an output block for conveyance to a destination processor.

64. The system according to claim 63, wherein the error correction term is equal to a binary difference between the input error detection code and the output error detection code.

65. The system according to claim 63, wherein the code calculator is adapted to determine the output error detection code by applying an XOR operation to the input error detection code and the error correction term.

66. The system according to claim 63, wherein the code calculator is adapted to determine the error correction term by processing data in each of the protocol-related sub-blocks and the input sub-blocks so as to compute respective output sub-block error detection codes.

67. A machine-readable storage having stored thereon, a computer program having at least one code section for data verification, the at least one code section being executable by a machine for causing the machine to perform steps comprising:
   receiving an input block of data together with a modulo-based input error detection code associated with the input block, the input block comprising a plurality of input sub-blocks;
generate one or more protocol-related sub-blocks to be incorporated together with the input sub-blocks in a specified order in an output block for conveyance to a destination processor;
   determining an error correction term based on the specified order of the protocol-related sub-blocks and the input sub-blocks;
   determining a modulo-based output error detection code responsively to the input error detection code and the error correction term; and
   concatenating the protocol-related sub-blocks, the input sub-blocks and the output error detection code to generate an output block for conveyance to a destination processor with the input block, the input block.

* * * * *